United States Patent
Rose

(10) Patent No.: US 6,773,617 B2
(45) Date of Patent: Aug. 10, 2004

(54) METHOD AND APPARATUS FOR RESTRICTING PROCESS FLUID FLOW WITHIN A SHOWERHEAD ASSEMBLY

(75) Inventor: David Jay Rose, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 47 days.

(21) Appl. No.: 10/309,863

(22) Filed: Dec. 4, 2002

(65) Prior Publication Data

US 2003/0080090 A1 May 1, 2003

Related U.S. Application Data

(62) Division of application No. 09/732,256, filed on Dec. 7, 2000, now Pat. No. 6,537,420.
(60) Provisional application No. 60/172,424, filed on Dec. 17, 1999.

(51) Int. Cl.[7] .......................... C23F 1/00; H01L 21/306
(52) U.S. Cl. ......................... 216/58; 216/67; 427/569; 427/248.1; 438/689; 438/710; 438/758
(58) Field of Search ...................... 216/58, 67; 427/569, 427/248.1; 438/689, 710, 758; 118/715; 156/345.33, 345.34

(56) References Cited

U.S. PATENT DOCUMENTS

| | | | |
|---|---|---|---|
| 4,340,462 A | | 7/1982 | Koch ......................... 204/298 |
| 5,000,113 A | * | 3/1991 | Wang et al. ............. 118/723 E |
| 5,252,178 A | | 10/1993 | Moslehi ....................... 156/643 |
| 5,266,153 A | * | 11/1993 | Thomas ....................... 134/1.1 |
| 5,286,297 A | | 2/1994 | Moslehi et al. .......... 118/723 E |
| 5,453,124 A | | 9/1995 | Moslehi et al. ............. 118/715 |
| 5,464,499 A | | 11/1995 | Moslehi et al. ................ 216/71 |
| 5,505,781 A | * | 4/1996 | Omori et al. ............... 118/726 |
| 5,624,498 A | | 4/1997 | Lee et al. .................... 118/715 |
| 5,948,167 A | * | 9/1999 | Baek et al. ............. 118/723 E |
| 5,950,925 A | | 9/1999 | Fukunaga et al. ........ 239/132.3 |
| 6,239,043 B1 | * | 5/2001 | Lai ............................. 438/782 |
| 6,415,736 B1 | * | 7/2002 | Hao et al. ................ 118/723 E |
| 6,514,348 B2 | * | 2/2003 | Miyamoto .................. 118/715 |
| 6,537,420 B2 | * | 3/2003 | Rose ...................... 156/345.34 |
| 2002/0069969 A1 | * | 6/2002 | Rose ...................... 156/345.34 |
| 2003/0080090 A1 | * | 5/2003 | Rose ........................... 216/67 |
| 2003/0228751 A1 | * | 12/2003 | Liao et al. .................. 438/629 |

* cited by examiner

*Primary Examiner*—Jeffrie R. Lund
(74) *Attorney, Agent, or Firm*—Yingsheng Tung; Wade James Brady, III; Frederick J. Telecky, Jr.

(57) ABSTRACT

A system and method are disclosed for restricting process fluid flow within a showerhead assembly which includes a process chamber (12) with a showerhead assembly (20) disposed therein. The showerhead assembly (20) has a blocking assembly (24) disposed within the showerhead assembly (20) for restricting the flow of process fluid within the showerhead assembly (20). Restricting the flow of process fluid within the showerhead effectively restricts the flow of process fluid exiting a center portion (30) of showerhead assembly (20), directed at a substrate wafer (16) disposed within the process chamber (12).

6 Claims, 2 Drawing Sheets

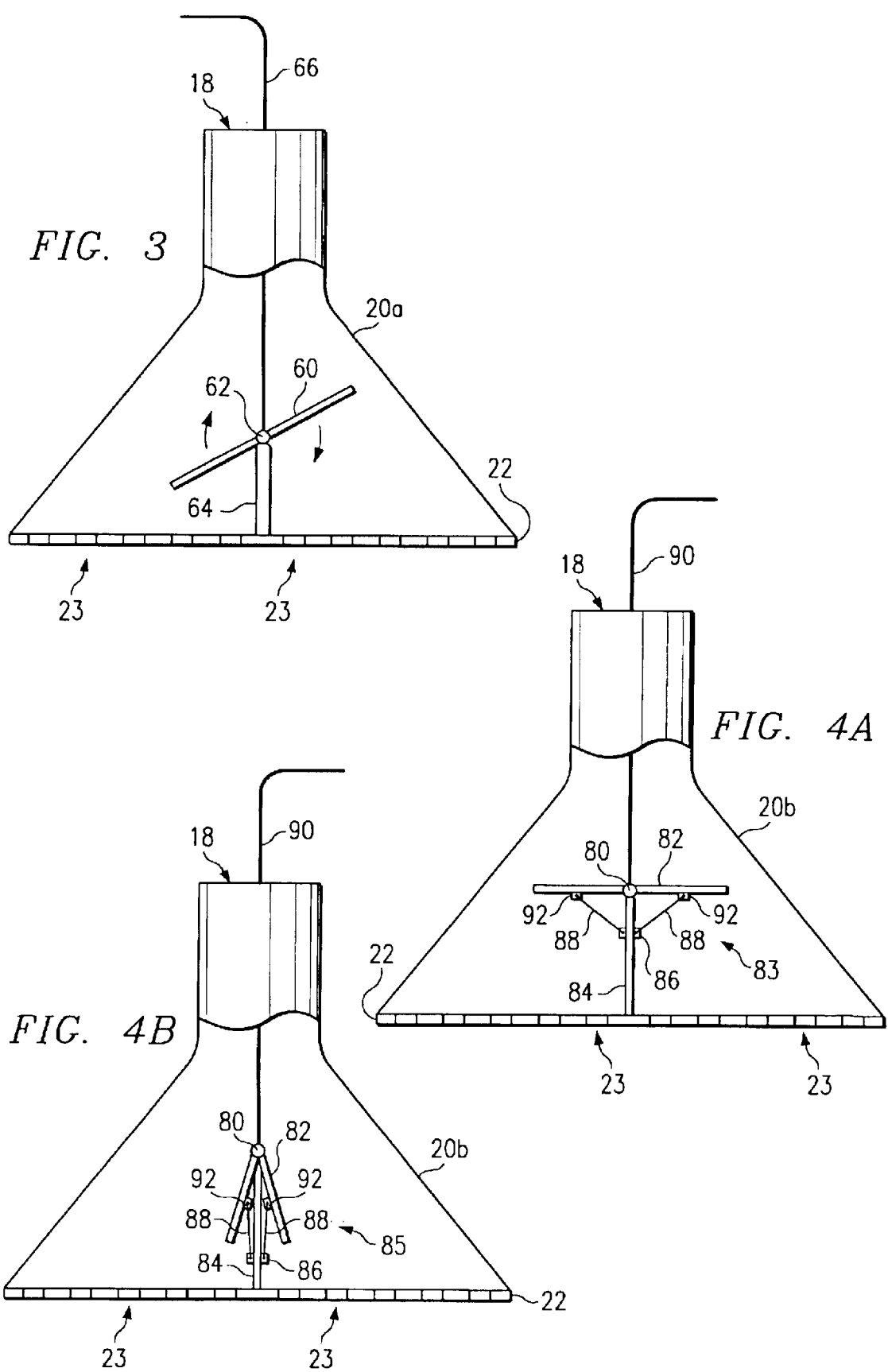

METHOD AND APPARATUS FOR RESTRICTING PROCESS FLUID FLOW WITHIN A SHOWERHEAD ASSEMBLY

This is a divisional application of Ser. No. 09/732,256 filed Dec. 7, 2000 now U.S. Pat No. 6,537,420, which claims priority under 35 USC 119(e)(1) of provisional application Ser. No. 60/172,424, filed Dec. 17, 1999.

TECHNICAL FIELD OF THE INVENTION

The invention relate in general to the field of electronic devices. More specifically the invention relates to a method and apparatus for restricting process fluid flow within a showerhead assembly.

BACKGROUND OF THE INVENTION

Semiconductor fabrication typically includes depositing material onto a semiconductor substrate wafer and etching material from the substrate. Often these processes take place within a process chamber containing one or more wafers and a deposition apparatus referred to as a showerhead. The showerhead acts to direct process fluid to the semiconductor substrate wafer. The showerhead typically includes an inlet conduit connected to a process fluid source outside of the process chamber. And a showerhead plate with a number of holes extending therethrough to direct process fluid exiting the showerhead to the semiconductor substrate wafer. Showerheads are also used in both material deposition and etching processes to direct deposition and etching fluid to the semiconductor substrate wafer.

Problematic edge effects often result from uneven deposition and etch across the radius of a semiconductor substrate wafer. These problems often result when the characteristics of a plasma field or the flow of process fluid varies between the center of the wafer and the edge of the wafer. Such nonuniform deposition and etch often results in a semiconductor substrate wafer with disparate electrical properties across its radius. Because of this disparity portions of the wafer are often not usable for their intended purpose. In the case of circular wafers, inadequate deposition and etching of material adjacent to the outer edge of the wafer often renders devices formed adjacent to the outer edge of the wafer defective. As wafer diameter increases from six inches to eight inches to twelve inches and beyond, the number of devices formed adjacent to the outer edge increases significantly. Therefore, edge defects for a twelve inch wafer result in a greater number of unusable devices as compared with a six inch wafer.

One past solution for controlling deposition and etch across the radius of a wafer was to alter the geometry of holes extending through a showerhead plate. This technique allows process fluid to be directed toward selected areas of the substrate wafer. Simply, to increase process fluid flow to selected areas, more or larger holes are formed in the showerhead plate opposite those areas. However, this solution suffers from a number of drawbacks. First, a specialized showerhead plate is typically formed for a particular process and is often not useful for other processes. Second, experimentation with a specialized showerhead plate is time consuming and expensive. A complete processing run is often required to evaluate the effectiveness of a particular geometry of holes in a showerhead plate. This consumes valuable resources and processing time. Third, the use of specialized showerhead plates for each deposition and etch process step can be costly, often requiring multiple showerhead assemblies to perform multiple processing steps and replacing showerhead assemblies to accomplish process changes.

SUMMARY OF THE INVENTION

In accordance with teachings of the present disclosure, a system and method are described for restricting process fluid flow within a showerhead assembly which substantially eliminates or reduces disadvantages and problems associated with prior apparatuses and methods used to deposit and etch materials during semiconductor fabrication. The apparatus includes a process chamber with a showerhead assembly disposed therein. The showerhead assembly includes a blocking assembly disposed within the showerhead assembly for restricting the flow of process fluid within the showerhead assembly. Restricting the flow of process fluid within the showerhead effectively restricts the flow of process fluid exiting the showerhead assembly, directed at a substrate wafer disposed within the process chamber.

In one aspect of the present invention a semiconductor processing apparatus is provided including a process chamber having a substrate support disposed within the process chamber operable to support a substrate wafer. A showerhead assembly is disposed within the process chamber facing the substrate support. The showerhead assembly has a showerhead plate that has passageways extending therethrough. An inlet conduit is coupled to the showerhead assembly to communicate process fluid from the exterior of the process chamber to the showerhead assembly. A blocking assembly is disposed within the showerhead assembly for restricting the flow of process fluid within the showerhead assembly.

In another aspect of the present invention a process fluid blocking assembly for controlling the flow of a process fluid through a showerhead apparatus used for semiconductor fabrication is disclosed. The process fluid blocking assembly includes a blocking device operable to be disposed adjacent to a showerhead plate such that the blocking device substantially restricts the flow of process fluid through a center portion of the showerhead plate.

More specifically, the blocking assembly may include a rod and a ring associated with the rod. The ring may be selectively moved between a first position along the rod and a second position along the rod. The blocking assembly also includes a plurality of linkages pivotally connecting the ring and an umbrella blocking assembly. A second end of each of the linkages is such that placing the ring in the first position expands the umbrella blocking assembly and placing the ring in the second position collapses the umbrella blocking assembly. When the umbrella blocking assembly is expanded, the umbrella blocking assembly acts to selectively restrict the flow of process fluid through the showerhead assembly. When the umbrella blocking assembly is collapsed, the umbrella assembly allows substantially unrestricted process fluid flow through the showerhead.

In yet another aspect of the present invention a method for fabricating a semiconductor device on a substrate wafer disposed includes supplying process fluid to a showerhead assembly positioned opposite the substrate wafer. The method also includes selectively positioning a blocking assembly within the showerhead assembly to selectively restrict the flow of process fluid from the showerhead assembly to the substrate wafer. This selective positioning selectively effects the fabrication of the semiconductor device.

The present invention provides a number of technical advantages. One technical advantage is having a blocking assembly disposed within the showerhead assembly. The blocking assembly can selectively control deposition and etching on the outer edge of a semiconductor substrate wafer. This also allows the apparatus to selectively vary deposition and etch edge effects in a plurality of processes.

Another technical advantage is disposing an umbrella blocking assembly that can be expanded or collapsed within the showerhead assembly. This allows the apparatus to selectively control the deposition and etching of material across the radius of a semiconductor substrate wafer.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 is a schematic diagram showing a showerhead assembly having a selectively rotateable blocking disk disposed therein according to teachings of the present invention;

FIG. 4A is a schematic diagram showing a showerhead assembly having an expanded umbrella type blocking assembly disposed therein according to teachings of the present invention; and FIG. 4B is a schematic diagram showing a showerhead assembly having a substantially collapsed umbrella type blocking assembly disposed therein according to teachings of the present invention.

DETAILED DESCRIPTION OF THE INVENTION

The preferred embodiments and their advantages are best understood by reference to FIGS. 1 through 4B, wherein like numbers are used to indicate like and corresponding parts.

Figure 1:
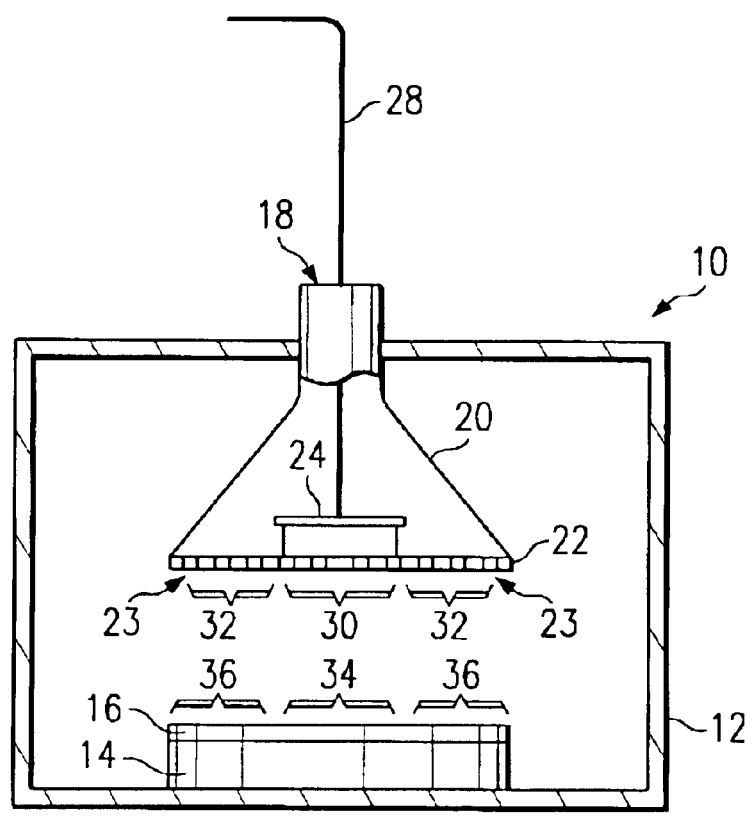
FIG. 1 is a schematic diagram showing a cross section view of a semiconductor processing apparatus according to teachings of the present invention.

FIG. 1 is a schematic diagram showing a cross-section view of a semiconductor processing apparatus, indicated generally at 10, incorporating teachings of the present invention. Semiconductor apparatus 10 includes process chamber 12 having substrate support 14 and showerhead assembly 20 disposed therein. Substrate support 14 is operable to support substrate wafer 16. Substrate 16 includes substrate center portion 34 and substrate outer portion 36. Showerhead assembly 20 includes showerhead plate 22 having a plurality of passageways 23 extending therethrough to allow process fluid to exit showerhead assembly 20. Blocking assembly 24 is disposed within showerhead assembly 20 for restricting process fluid flow within showerhead assembly 20. Blocking assembly 24 is preferrably disposed within showerhead assembly 20 above center portion 30 of showerhead plate 22 to restrict process fluid flow through center portion 30. Process fluid flow through outer portion 32 of showerhead plate 22 is not substantially restricted by blocking assembly 24.

Inlet conduit 18 is coupled to showerhead assembly 20 to communicate process fluid from the exterior of process chamber 12 to showerhead assembly 20. Process fluid may comprise any process fluid used in deposition or etch processing suitable to be supplied through showerhead assembly 20. Inlet conduit 18 is preferably in fluid communication with the process fluid source and may further be in fluid communication with a process fluid controller (not expressly shown) operable to selectively allow process fluid to communicate from the process fluid source to inlet conduit 18.

Figure 2:
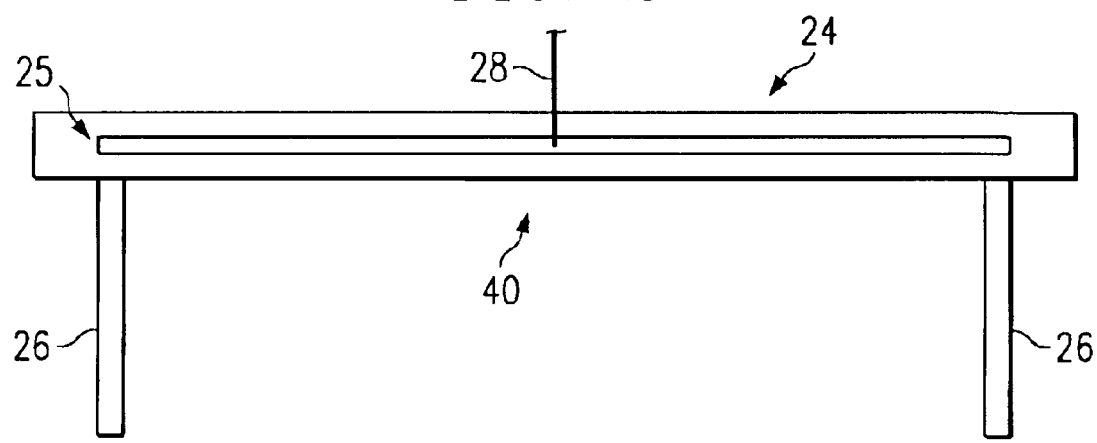
FIG. 2 is a schematic diagram showing a blocking assembly having a heating element disposed therein according to teachings of the present invention.

Control cable 28 is coupled to blocking assembly 24 for operating heating element 40 as shown in FIG. 2. Control cable 28 extends through inlet conduit 18 and connects to a power source (not expressly shown) located external to conductor processing apparatus 10.

In the present embodiment blocking assembly 24 and showerhead plate 22 have substantially circular configurations. Blocking assembly 24 has an outer diameter smaller than the outer diameter of showerhead plate 22. Blocking assembly 24 is positioned such that the blocking assembly 24 substantially restricts the flow of process fluid through a center portion 30 of showerhead plate 22. Blocking assembly 24 may comprise a blocking disk 25 as shown in FIG. 2 disposed adjacent to showerhead plate 22 to restrict the flow of process fluid through a portion of showerhead plate 22. An alternative embodiment blocking assembly 24 may include a plurality of alternative blocking disks (not expressly shown) having a plurality of diameters. The plurality alternative blocking disks may be disposed adjacent to showerhead plate 22 for selectively restricting the flow of process fluid through respective portions of showerhead plate 22.

In operation, process fluid is supplied to showerhead assembly 20 through inlet conduit 18. Blocking assembly 24 is selectively positioned within showerhead assembly 20 to restrict the flow of process fluid exiting showerhead 20. Preferably, the blocking assembly restricts the flow of process fluid through a center portion 30 of showerhead plate 22. After exiting showerhead plate 22, process fluid may deposit material onto substrate wafer 16 or process fluid may etch a portion of substrate wafer 16. Preferably, a greater amount of process fluid exits the outer portion 32 of showerhead plate 22 causing a greater amount of deposition or etch on substrate outer portion 36.

FIG. 2 is a schematic diagram showing blocking assembly 24 having a heating element 40 disposed therein according to teachings of the present invention. Blocking disk 25 is supported by support members 26. Heating element 40 is disposed within blocking disk 25. Control cable 28 communicates electrical power to heating element 40.

Control cable 28 may be electrically connected to an electrical power source (not expressly shown). Support members 26 may be operable to releasably engage a portion of showerhead plate 22 as shown in FIG. 1. Support members 26 are coupled to blocking disk 25 to support blocking disk 25 in a plane substantially parallel to showerhead plate 22 as shown in FIG. 1.

In operation, process fluid enters showerhead assembly 20 through inlet conduit 18. Power may be selectively supplied to heating element 40 through control cable 28. As the temperature of heating element 40 increases, the temperature of blocking disk 25 also increases. The heated blocking disk 25 heats process fluid within showerhead assembly 20. Because the deposition rate of some process fluids increases as their temperature increases, selectively heating blocking disk 25 selectively effects the process fluid deposition rate.

In an alternative embodiment, support members 26 may be variable length support members (not expressly shown) such that the distance between showerhead plate 22 and blocking disk 25 as shown in FIG. 1 may vary. Variable length support member 26 may have a telescoping configuration operated electrically, mechanically or pneumatically via a controller cable (not expressly shown). In operation, selectively varying the length of support members 26 selectively restricts the flow of process fluid within showerhead assembly 20. Varying the distance between showerhead plate 22 and blocking disk 25 affects the flow of process fluid within showerhead assembly 20 and exiting showerhead plate 22. Selectively varying the length of the variable length support members therefore selectively controls the flow of process fluid exiting showerhead plate 22 and interacting with substrate wafer 16.

Restricting the flow of process fluid exiting center portion 30 of showerhead plate 22 allows increased process fluid flow through outer portion 32 of showerhead plate 22. Process fluid exiting outer portion 32 of showerhead plate 22 is directed toward wafer outer portion 36 and the flow of process fluid to wafer inner portion 34 is substantially restricted.

FIG. 3 is a schematic diagram showing a showerhead assembly 20a having a selectively rotatable blocking disk 60 disposed therein according to teachings of the present invention. Showerhead assembly 20a includes showerhead plate 22 having a plurality of passageways 23 extending therethrough. Support member 64 is coupled to showerhead plate 22 in a substantially perpendicular position relative to showerhead plate 22. Hinge assembly 62 is coupled to support member 64 distal showerhead plate 22. Rotatable blocking disk 60 is pivotally coupled to hinge assembly 62.

Rotatable blocking disk 60 is operable to selectively rotate from a first position substantially parallel to showerhead plate to a position substantially perpendicular to showerhead plate 22. When rotatable blocking disk 60 is in the first position-substantially parallel to showerhead plate 22 rotatable blocking disk 60 substantially restricts the flow of process fluid within showerhead assembly 20a. When rotatable blocking disk 60 is in the second position substantially perpendicular to the showerplate 22 the rotatable blocking disk allows substantially unrestricted flow within showerhead assembly 20a.

Control cable 66 is preferably connected to hinge assembly 62. Control cable 66 is operable to activate hinge assembly 62 to selectively rotate blocking disk 60 between the first position and the second position.

In operation, process fluid is communicated through inlet conduit 18 and enters showerhead assembly 20a. When rotatable blocking disk 60 is in the first position substantially parallel to showerhead plate 22, the flow of process fluid through showerhead assembly 20a is substantially restricted such that the flow of processed fluid through a center portion of showerhead plate 22 is substantially restricted. The flow of processed fluid through an outer portion of showerhead plate 22 is substantially unrestricted. Process fluid exiting the outer the portion of showerhead plate 22 is directed generally towards an outer portion 36 of substrate wafer 16 disposed within a process chamber 12 (as shown in FIG. 1). During a deposition process a greater amount of material will be deposited on outer portion 36 of substrate wafer 16 during this process. When rotatable blocking disk is in the second position substantially perpendicular to showerhead plate 22, the flow of process fluid through the showerhead assembly 20a is substantially unrestricted. Process fluid exits through passageways 23 and is directed generally toward substrate wafer 16 disposed within process chamber 12 (as shown in FIG. 1).

Hinge assembly 62 may include a mechanical or electrical hinge component operated by control cable 66. Rotatable blocking disk 60 may be any suitable blocking disk sized for rotation within showerhead 20a.

FIG. 4A is schematic drawing showing a showerhead assembly 20b having an expanded umbrella type blocking assembly 82 disposed therein according to the teachings of the present invention. Showerhead assembly 20b includes inlet conduit 18 for communicating process fluid into showerhead assembly 20b. Showerhead assembly 20b also includes showerhead plate 22 that has a plurality of passageways 23 extending therethrough. Rod 84 is coupled to showerhead plate 22. Ring 86 is associated with rod 84. Ring 86 is selectively movable between first position 83 along rod 84 and second position 85 along rod 84 (as shown in FIG. 4B). Linkages 88 are pivotally coupled to ring 86 and to the umbrella blocking assembly 82 at attaching elements 92.

Umbrella blocking assembly 82 has a center portion 80 disposed adjacent to rod 84 distal showerhead plate 22. Umbrella blocking assembly 82 is pivotally connected to linkages 88 disposed circumferentially about umbrella blocking assembly 82. Linkages 88 are connected distal pivot connections at ring 86. The present embodiment shows ring 86 in first position 83 such that umbrella blocking assembly 82 is expanded. When umbrella blocking assembly 82 is expanded, it substantially restricts the flow of process fluid within showerhead assembly 20b. Umbrellas blocking assembly 82 is sized to fully expand within showerhead assembly 20b. Umbrella blocking assembly 82 may be constructed using any flexible material suitable for use within the showerhead environment. Examples of materials which may be used in the construction of umbrella blocking assembly 82 may include, for example: silicones, polyphosphazenes, TEFLON™, polyurethane, high temperature nylon, and saturated organic polymers. Ring 86 is associated with control cable 90 such that operation of control cable 90 selectively moves ring 86 between first position 83 and second position 85.

FIG. 4B is a schematic diagram showing the showerhead assembly of FIG. 4A having a substantially collapsed umbrella-type blocking assembly 82 disposed therein according to teachings of the present invention. Ring 86 is positioned in the second position 85 effectively collapsing umbrella blocking assembly 82. As ring 86 selectively moves down rod 84, linkages 88 collapse umbrella blocking assembly 82.

In operation, process fluid is communicated into showerhead assembly 20b through inlet conduit 18. When umbrella blocking assembly 82 is in an expanded position, flow of process fluid within the showerhead assembly 20b is substantially restricted. Preferably, the flow of process fluid exiting a center portion of showerhead plate 22 through passageways 23 is substantially restricted and the flow of process fluid exiting outer portions of showerhead plate 22 through passageways 23 is substantially unrestricted. Process fluid exiting showerhead assembly 20b directed at substrate wafer 16 (as shown in FIG. 1) is partially restricted such that the flow of process fluid to center portion 34 of substrate wafer 16 is substantially restricted while the flow of process fluid to an outer portion 36 of substrate wafer 16 is substantially unrestricted. During deposition processes, material deposited on the outer portion of substrate wafer 16 is greater than the amount of material deposited on the center portion 34 of substrate wafer 16 (as shown in FIG. 1).

When umbrella blocking assembly 82 is in the second position 85, the flow of process fluid within showerhead assembly 20b is substantially unrestricted. The flow of process fluid exiting showerhead plate 22 through passage ways 23 is substantially unrestricted. During processing, umbrella blocking assembly may be operated by control cable 90 such that umbrella blocking assembly 82 may selectively collapse or expand before, during, or after processing, such that the flow of process fluid through showerhead assembly 20b may be selectively controlled.

Although the disclosed embodiments have been described in detail, it should be understood that various changes, substitutions and alterations can be made to the embodiments without departing from their spirit and scope.

What is claimed is:

1. A method for fabricating a semiconductor device on a substrate wafer disposed in a semiconductor fabrication apparatus comprising:

supplying process fluid to a showerhead assembly positioned opposite the substrate wafer; and adjusting the position of a blocking assembly within the showerhead assembly to restrict the flow of process fluid from the showerhead assembly to the substrate wafer, thereby affecting the fabrication of the semiconductor device.

2. The method of claim 1 further comprising moving the blocking assembly to a position restricting the flow of process fluid through a center portion of the showerhead plate.

3. The method of claim 1 further comprising selectively varying the position of the blocking assembly within the showerhead assembly.

4. The method of claim 1 further comprising selectively varying the power supplied to a heating element disposed within the blocking assembly.

5. The method of claim 1 further comprising the process fluid depositing a material on the substrate wafer.

6. The method of claim 1 further comprising the process fluid etching a portion of the substrate wafer.

* * * * *